(12) United States Patent
Horng et al.

(10) Patent No.: US 7,964,470 B2
(45) Date of Patent: Jun. 21, 2011

(54) FLEXIBLE PROCESSING METHOD FOR METAL-INSULATOR-METAL CAPACITOR FORMATION

(75) Inventors: Shean-Ren Horng, Tainan (TW); Kuo-Nan Hou, Tainan (TW); Feng-Liang Lai, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 123 days.

(21) Appl. No.: 11/365,237

(22) Filed: Mar. 1, 2006

(65) Prior Publication Data

US 2007/0205248 A1    Sep. 6, 2007

(51) Int. Cl.
*H01L 21/20*    (2006.01)

(52) U.S. Cl. ............ 438/393; 438/396; 257/E21.008; 257/E21.009; 257/E21.011

(58) Field of Classification Search .......... 438/393; 257/E21.008, E21.009, E21.011
See application file for complete search history.

(56) References Cited

U.S. PATENT DOCUMENTS

| | | | |
|---|---|---|---|
| 5,708,559 A * | 1/1998 | Brabazon et al. | 361/313 |
| 5,990,015 A * | 11/1999 | Lin et al. | 438/706 |
| 6,069,051 A | 5/2000 | Nguyen et al. | |
| 6,081,021 A * | 6/2000 | Gambino et al. | 257/530 |
| 6,083,785 A | 7/2000 | Segawa et al. | |
| 6,100,155 A * | 8/2000 | Hu | 438/386 |
| 6,140,693 A | 10/2000 | Weng et al. | |
| 6,180,976 B1 * | 1/2001 | Roy | 257/306 |
| 6,259,128 B1 * | 7/2001 | Adler et al. | 257/301 |
| 6,271,084 B1 | 8/2001 | Tu et al. | |
| 6,284,590 B1 | 9/2001 | Cha et al. | |
| 6,284,619 B1 | 9/2001 | Seymour et al. | |
| 6,329,234 B1 | 12/2001 | Ma et al. | |
| 6,342,734 B1 * | 1/2002 | Allman et al. | 257/758 |
| 6,344,964 B1 * | 2/2002 | Adler | 361/306.3 |
| 6,358,792 B1 | 3/2002 | Hsue et al. | |
| 6,387,770 B2 * | 5/2002 | Roy | 438/384 |
| 6,436,787 B1 | 8/2002 | Shih et al. | |
| 6,441,419 B1 * | 8/2002 | Johnson et al. | 257/296 |
| 6,472,721 B2 | 10/2002 | Ma et al. | |
| 6,483,142 B1 * | 11/2002 | Hsue et al. | 257/306 |
| 6,492,226 B1 * | 12/2002 | Hsue et al. | 438/253 |
| 6,500,724 B1 | 12/2002 | Zurcher et al. | |
| 6,559,493 B2 | 5/2003 | Lee et al. | |
| 6,576,525 B2 | 6/2003 | Stamper | |
| 6,677,635 B2 * | 1/2004 | Ning et al. | 257/303 |

(Continued)

FOREIGN PATENT DOCUMENTS

JP    2001-237375    8/2001

(Continued)

*Primary Examiner* — Thao X Le
*Assistant Examiner* — Eric W Jones
(74) *Attorney, Agent, or Firm* — Slater & Matsil, L.L.P.

(57) ABSTRACT

A method for forming a metal-insulator-metal (MIM) capacitor includes forming a capacitor bottom plate and a metal interconnect feature on a substrate. A dielectric layer having a predetermined thickness is then formed. The dielectric layer has a first portion overlying the capacitor bottom plate and a second portion overlying the metal interconnect feature. The dielectric layer is processed to adjust the thickness of the first portion of the dielectric layer relative the thickness of the second portion of the dielectric layer. Processing can include etching the first portion of the dielectric layer or adding dielectric material to the second portion of the dielectric layer. A capacitor top plate is formed over the first portion of the dielectric layer to complete the MIM structure.

10 Claims, 8 Drawing Sheets

U.S. PATENT DOCUMENTS

| | | | |
|---|---|---|---|
| 6,680,542 B1 | 1/2004 | Gibson et al. | |
| 6,706,591 B1 | 3/2004 | Chan et al. | |
| 6,709,918 B1 | 3/2004 | Ng et al. | |
| 6,723,600 B2 | 4/2004 | Wong et al. | |
| 6,730,573 B1 | 5/2004 | Ng et al. | |
| 6,746,914 B2 * | 6/2004 | Kai et al. | 438/253 |
| 6,787,907 B2 | 9/2004 | Watanabe et al. | |
| 6,803,306 B2 * | 10/2004 | Tsau | 438/622 |
| 6,825,092 B2 | 11/2004 | Zurcher et al. | |
| 6,838,717 B1 * | 1/2005 | Yen et al. | 257/295 |
| 6,881,999 B2 * | 4/2005 | Lee et al. | 257/306 |
| 6,888,220 B2 * | 5/2005 | Akiyama | 257/532 |
| 6,894,331 B2 | 5/2005 | Yoshitomi et al. | |
| 6,924,207 B2 * | 8/2005 | Son et al. | 438/396 |
| 7,122,878 B2 * | 10/2006 | Huang et al. | 257/532 |
| 7,242,096 B2 | 7/2007 | Kanamura | |
| 7,279,733 B2 * | 10/2007 | Lee et al. | 257/303 |
| 7,294,544 B1 * | 11/2007 | Ho et al. | 438/250 |
| 7,304,386 B2 | 12/2007 | Kanamura | |
| 7,371,651 B2 * | 5/2008 | Won | 438/393 |
| 7,482,241 B2 * | 1/2009 | Shim | 438/396 |
| 2002/0094656 A1 * | 7/2002 | Armacost et al. | 438/396 |
| 2003/0006480 A1 * | 1/2003 | Lian et al. | 257/532 |
| 2004/0106266 A1 * | 6/2004 | Huang et al. | 438/393 |
| 2004/0124496 A1 * | 7/2004 | Rao et al. | 257/532 |
| 2004/0201057 A1 * | 10/2004 | Lien et al. | 257/306 |
| 2005/0263848 A1 * | 12/2005 | Cho | 257/532 |
| 2005/0275005 A1 * | 12/2005 | Choi et al. | 257/300 |
| 2006/0121671 A1 * | 6/2006 | Yamamoto et al. | 438/240 |
| 2007/0057305 A1 | 3/2007 | Oates et al. | |
| 2007/0155091 A1 * | 7/2007 | Park | 438/253 |

FOREIGN PATENT DOCUMENTS

| | | |
|---|---|---|
| JP | 2002-359292 | 12/2002 |
| JP | 2004-193602 | 7/2004 |
| TW | 471045 B | 1/2002 |
| TW | 503575 B | 9/2002 |
| TW | 200507108 | 2/2005 |
| TW | 248647 B | 2/2006 |

* cited by examiner

US 7,964,470 B2

FLEXIBLE PROCESSING METHOD FOR METAL-INSULATOR-METAL CAPACITOR FORMATION

TECHNICAL FIELD

The present invention relates generally to a semiconductor process method for passive devices, and more particularly to a flexible processing method for Metal-Insulator-Metal (MIM) capacitors.

BACKGROUND

Generally, various Damascene MIM (DA-MIM) capacitor structures are formed within InterMetal Dielectric (IMD) layers. Complicated processes are involved for such formation which include: (1) deposition of an IMD layer for forming within a Capacitor Bottom Metal (CBM) plate, (2) barrier layer deposition, seed layer deposition and bulk metal layer deposition for forming the CBM plate in the IMD layer, (3) deposition of the insulating film for the capacitor dielectric over the CBM plate, (4) barrier layer deposition, seed layer deposition and bulk metal layer deposition for forming a Capacitor Top Metal (CTM) plate over the insulator, and (5) deposition of a via etch stop layer on the CTM plate. One disadvantage of the prior art is that the current DA-MIM process requires several extra masks for formation of the MIM Capacitor. Therefore, it is complicated and costly.

What is needed then is a DA-MIM capacitor formation process and resulting structure that is less costly and complicated than current processes and structures.

SUMMARY OF THE INVENTION

These and other problems are generally solved or circumvented, and technical advantages are generally achieved by preferred embodiments of the present invention, which include a flexible process for forming DA-MIM capacitors.

In accordance with a preferred embodiment of the present invention, the invention provides for a method for forming a metal-insulator-metal (MIM) capacitor. The method includes forming a capacitor bottom plate and a metal interconnect feature on a substrate, and forming a dielectric layer to a predetermined thickness, the dielectric layer having a first portion overlying the capacitor bottom plate and having a second portion overlying the metal interconnect feature. The method also includes processing the dielectric layer to adjust the thickness of the first portion of the dielectric layer relative the thickness of the second portion of the dielectric layer, and forming a capacitor top plate over the first portion of the dielectric layer.

In another aspect, the present invention provides for a method of forming an integrated circuit comprising forming a plurality of circuit elements in a substrate and forming a first metal layer over the substrate, the first metal layer including a capacitor bottom plate and an interconnect feature. The method further includes forming a dielectric layer of substantially uniform thickness over the first metal layer, and adjusting the thickness of the dielectric layer over the capacitor bottom plate, relative the thickness of the dielectric layer over the interconnect feature. The method also includes forming a capacitor top plate over the capacitor bottom plate; and forming an inter-metal dielectric layer over the capacitor top plate and the dielectric layer.

In yet another aspect, the present invention provides for an integrated circuit device. The device includes a capacitor bottom plate formed in a first metal layer and an interconnect feature formed in the first metal layer. The device further includes a continuous dielectric layer formed over the capacitor bottom plate and the interconnect feature, the continuous dielectric layer having a first thickness over the capacitor bottom plate and a second thickness over the interconnect feature. The second thickness is greater than the first thickness. The integrated circuit device also includes a capacitor top plate on the dielectric layer overlying the capacitor bottom plate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor processing method for forming a DA-MIM capacitor. The invention may also be applied, however, to other DA-MIM components.

Figure 1:
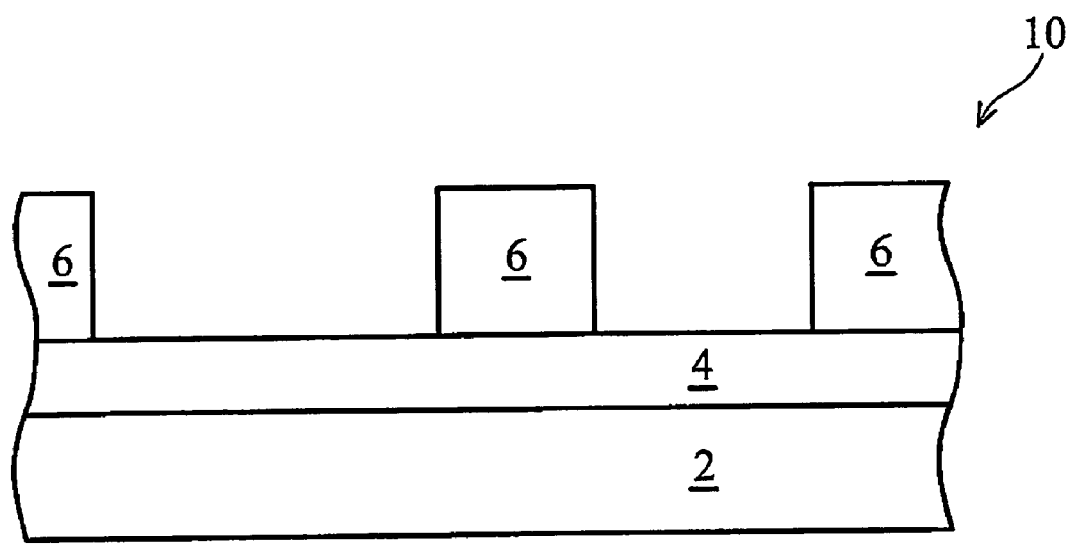
FIG. 1 is a cross-sectional view of a first mask stage for an exemplary CBM and inter-connector M7.

FIG. 1 schematically illustrates in cross-section a semiconductor device 10 in an intermediate stage of manufacture. Device 10 includes a substrate 2 in which various active and passive elements (not shown) have been manufactured. Additionally, substrate 2 may include various interconnection layers and interlayer vias, as is well known in the art. In one exemplary embodiment, six interconnection layers (not shown) are formed in substrate 2 and a capacitor bottom plate will be formed in the seventh metal layer, as will be described in detail below. One skilled in the art will recognize that the capacitor structure of the preferred embodiments of the present invention can be formed in other metal layers as a matter of design choice.

As shown, a dielectric layer 4, commonly referred to as an inter-metal dielectric (IMD), is formed over the substrate 2 (i.e., over the underlying devices and layers). IMD 4 is preferably formed of a low k dielectric material such as silicon oxide, silicon nitride, spin-on-glass ("SOG"), TEOS, halogenated SiO, fluorinated silicate glass ("FSG") or the like, and is preferably deposited by spin-on techniques, electro-chemical plating, chemical vapor deposition ("CVD"), physical vapor deposition ("PVD"), atomic layer deposition ("ALD"), molecular beam epitaxy CVD, and the like. One skilled in the art will recognize that the particular composition of IMD 4 is a matter of design choice. Typically, IMD 4 is deposited to a thickness ranging from 500 to 50,000 (for ultra thick metal) Angstroms. Also shown in FIG. 1 is photoresist layer 6 that has been deposited over IMD 4 and patterned using known photolithographic techniques with an appropriate photolithographic mask for the Capacitor Bottom Metal (CBM) plate. As shown, openings are formed in photoresist layer 6, exposing portions of underlying IMD 4 for forming the CBM. Other metal features are often formed simultaneously as well, such as metal interconnects.

Figure 2A:
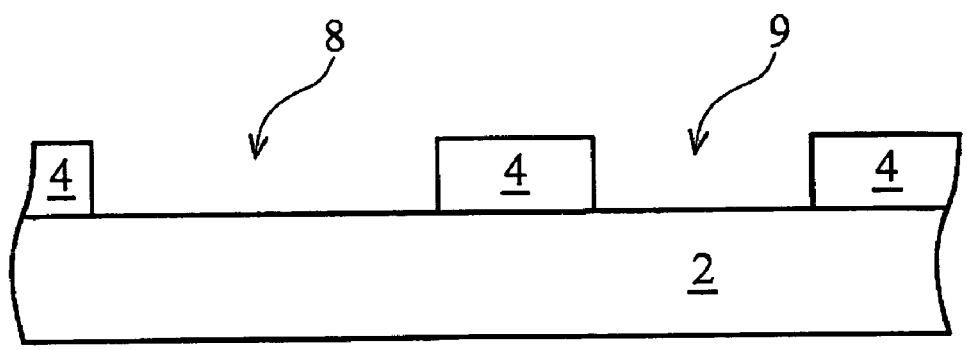
FIGS. 2A and 2B are cross-sectional views showing the etching and deposition stage, respectively, for CBM and M7 of the first exemplary embodiment.

FIG. 2A illustrates the device of FIG. 1 after IMD 4 has been etched in the regions exposed by patterned photoresist layer 6 forming trenches 8 and 9, respectively. Preferably, IMD 4 is anisotropically etched using known etching techniques such as sputter etching, ion-beam etching, plasma etching, and the like, although other techniques could be employed. After the etch step, photoresist layer 6 is removed, again using conventional techniques, such as stripping, ashing and the like.

Figure 2B:
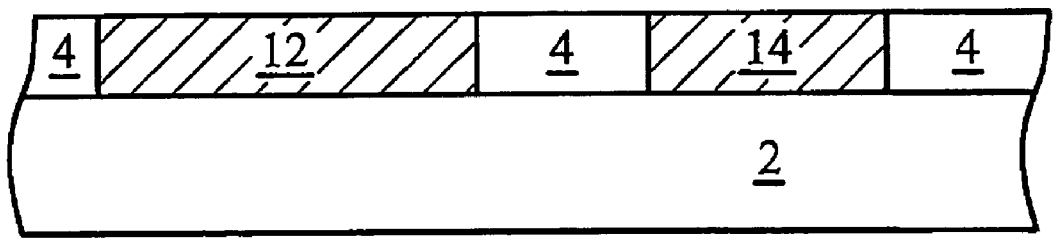

As shown in FIG. 2B, trenches 8 and 9 are filled with a conductor, preferably copper, using conventional damascene processing techniques. Typically, the trenches are initially lined with a barrier layer/adhesive layer, such as titanium/titanium nitride, or tantalum/tantalum nitride. A copper seed layer is formed over the barrier/adhesive layer(s), after which the trenches are overfilled with a copper layer using electroless plating, electrochemical plating, or the like. The copper layer is then planarized, preferably using a chemical mechanical polish (CMP), as is known in the art.

Illustrated in FIG. 2B are two metal features 12 and 14. As will be explained in greater detail below, feature 12 will serve as the bottom capacitor plate of a preferred embodiment metal-insulator-metal (MIM) capacitor structure. Feature 14 is preferably an interconnect structure by which various passive and active elements (not shown) can be interconnected and/or connected to external components. One skilled in the art will recognize that numerous metal features per metal layer (possibly millions) will likely be simultaneously formed in a typical integrated circuit design.

Figure 3:
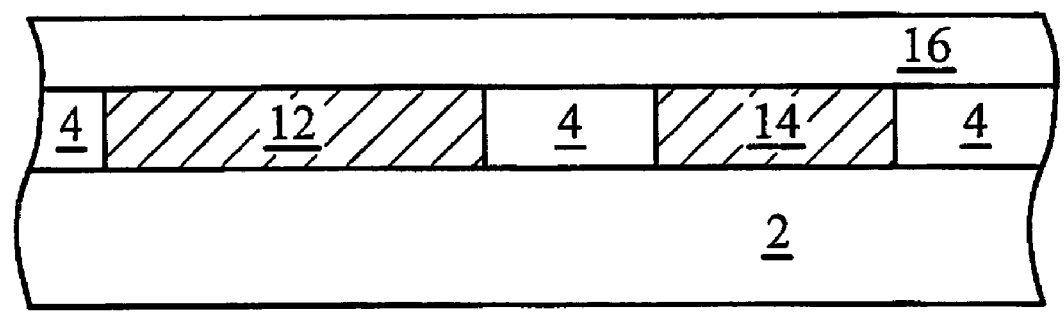
FIG. 3 is a cross-sectional view of the deposition stage for an exemplary Via Etch Stop Layer (VESL)

FIG. 3 illustrates the structure of FIG. 2B after formation of a dielectric layer 16. As will be explained in greater detail below, dielectric layer 16 will serve a dual purpose. A portion of dielectric layer 16 will serve as the dielectric insulating film for the subsequently formed MIM capacitor. Another portion of dielectric layer 16 will serve as a Via Etch Stop Layer (VESL) for subsequent via formation steps. As one skilled in the art will appreciate, it is desirable that the dielectric layer 16 be relatively thin in order to increase the capacitance of the resulting MIM capacitor. On the other hand, it is desirable that the dielectric layer 16 be thick enough to satisfy the functional requirements of an etch stop layer for the subsequently formed via. These two requirements are in conflict.

To overcome this thickness dilemma, in a preferred embodiment of the present invention, dielectric layer 16 is deposited at a thickness that is desirable for the VESL function, over the IMD 4 and metal features 12 and 14. Dielectric layer 16 is preferably formed of a high k dielectric material, such as $Al_2O_3$, $Hfo_2$, SiC, SiN, $Ta_2O_5$, TaON, $TiO_2$, $ZrO_2$, or the like. Dielectric layer 16 is preferably deposited by to a thickness of from about 100 Angstroms to about 1000 Angstroms; preferably by CVD or PVD deposition. While a thickness range for preferred embodiments is provided, one skilled in the art will recognize that the appropriate film thickness will depend upon numerous design and performance characteristics.

Figure 4:
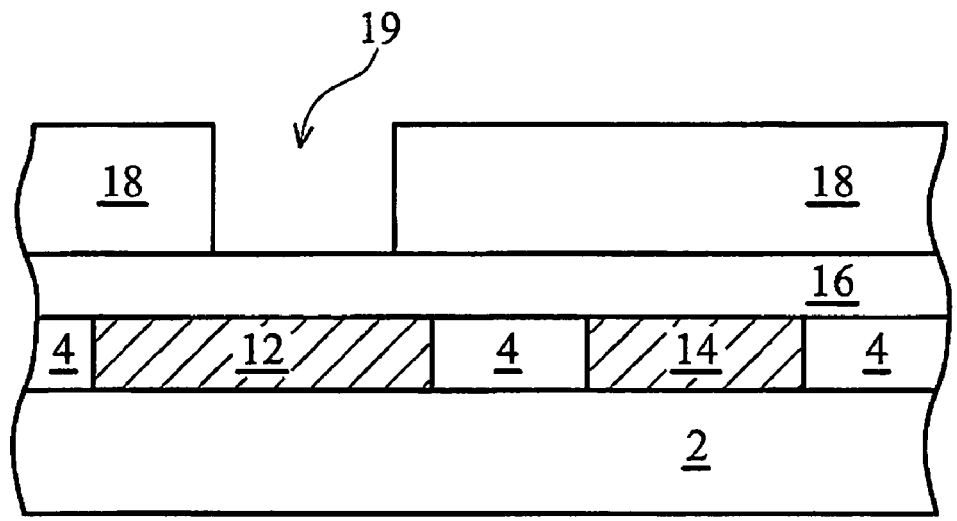
FIG. 4 is a cross-sectional view of a first mask stage for an exemplary CTM.

FIG. 4 illustrates the intermediate device of FIG. 3 after formation of a photoresist 18 that has been formed and patterned atop dielectric layer 16. Note the formation of an opening 19 in photoresist 18, which opening corresponds to the desired size and dimensions of the resulting MIM capacitor.

Figure 5:
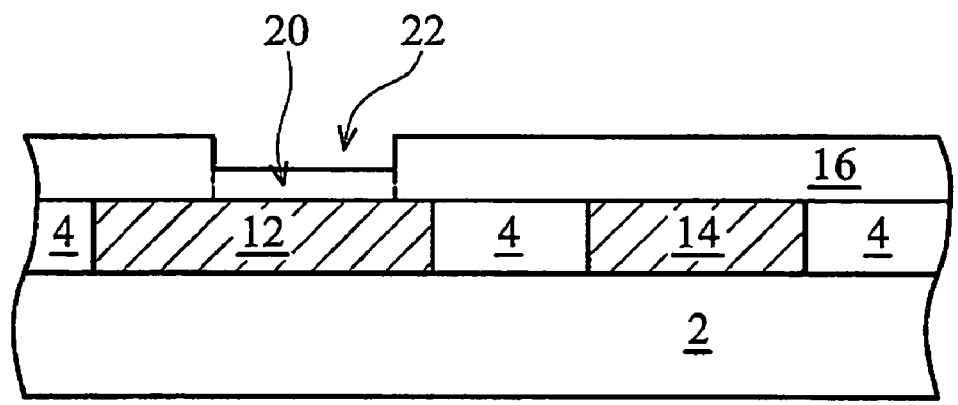
FIG. 5 is a cross-sectional view of the photo exposition stage for CTM of the first exemplary embodiment.

FIG. 5 illustrates a cross-sectional structure of the device process after dielectric layer 16 has been etched in those regions exposed by photoresist layer 18 (specifically the hole 19 illustrated in FIG. 4, as an example) and photoresist layer 18 has been removed. In a preferred embodiment, dielectric layer 16 is anisotropically etched using, e.g., dry etching for a period of about 30 seconds. Note that capacitor dielectric region 20 of dielectric layer 16 is appreciably thinned as a result of the etch step. Although the desired thickness of capacitor dielectric region 20 will depend upon design choices, in a preferred embodiment, capacitor dielectric region 20 is etched back to a thickness of from about 100 Angstroms to about 500 Angstroms, in order to provided desirable capacitance in the resulting MIM capacitor. Note also that the etch step provides a trench 22 in dielectric layer 16 which can be used to self-align the Capacitor Top Metal (CTM) plate, as described below.

Figure 6:
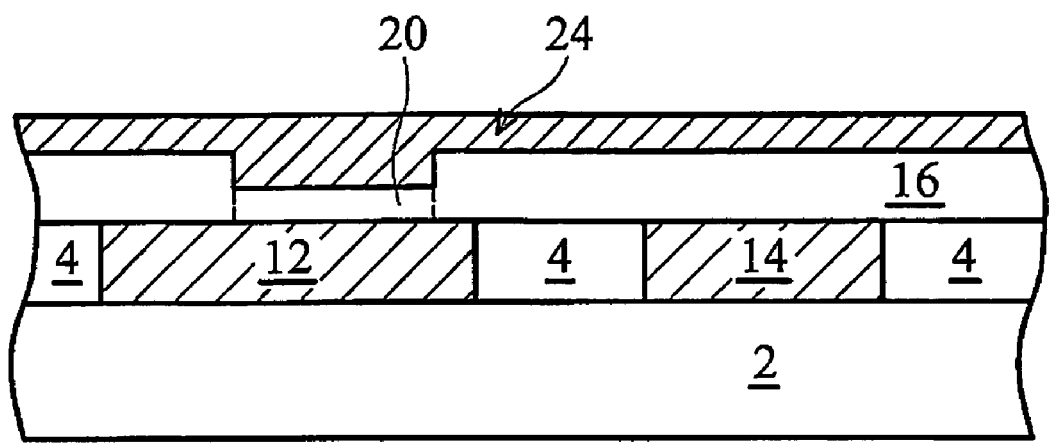
FIG. 6 is a cross-sectional view of the deposition stage for the exemplary CTM.

As illustrated in FIG. 6, the CTM is preferably formed by blanket depositing a metal layer 24 over the intermediate structure of FIG. 5. Preferably, metal layer 24 includes a barrier and/or adhesion layer, such as Titanium/Titanium Nitride/Tantalum/Tantalum Nitride formed over dielectric layer 16, including within trench 22, followed by s copper seed layer and finally a bulk copper layer, as is well known in the art. Alternatively, metal layer 24 could be formed of aluminum, gold, silver, platinum, tantalum, titanium, tungsten, and alloys of these metals, or the like. Layer 24 is preferably deposited to a thickness sufficient to overfill trench 22 as illustrated in FIG. 6. Depending upon design choices, the thickness of the metal layer 24 may typically range from a few hundred to a few thousand Angstroms.

Figure 7:
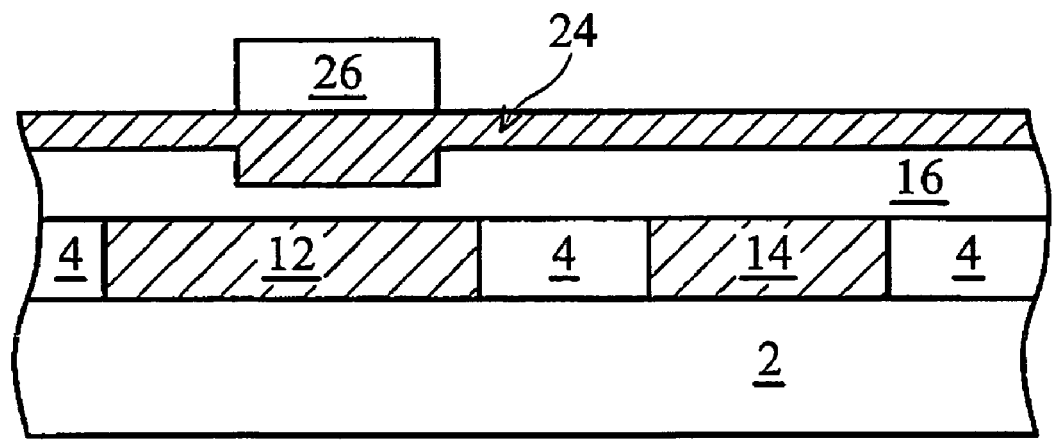
FIG. 7 is a cross-sectional view of a second mask stage for the exemplary CTM.
Figure 8:
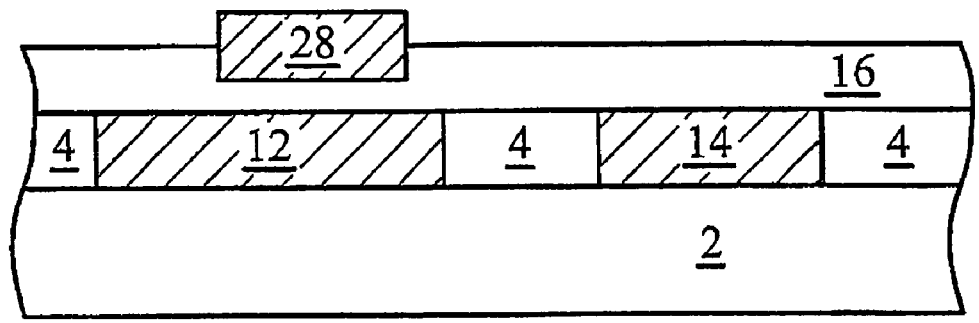
FIG. 8 is a cross-sectional view of the etching stage for the exemplary CTM.

As illustrated in FIG. 7, photoresist layer 26 is formed and patterned over the device to cover that portion of metal layer 24 overlying trench 22. In some embodiments, photoresist layer 26 can be formed using the same mask pattern as that used for patterning photoresist layer 18 (see FIG. 4). Layer 24 is then anisotropically etched using known techniques to pattern the layer. The resulting structure, shown in FIG. 8, includes CTM plate 28 aligned over the thin capacitor dielectric region 20 of dielectric layer 16, which further acts as an etch stop layer for subsequently formed vias. Having formed the MIM capacitor structure with a minimum of additional masking steps and cost, the integrated circuit device can be completed using conventional Back End of Line (BEOL) processes.

Figure 9A:
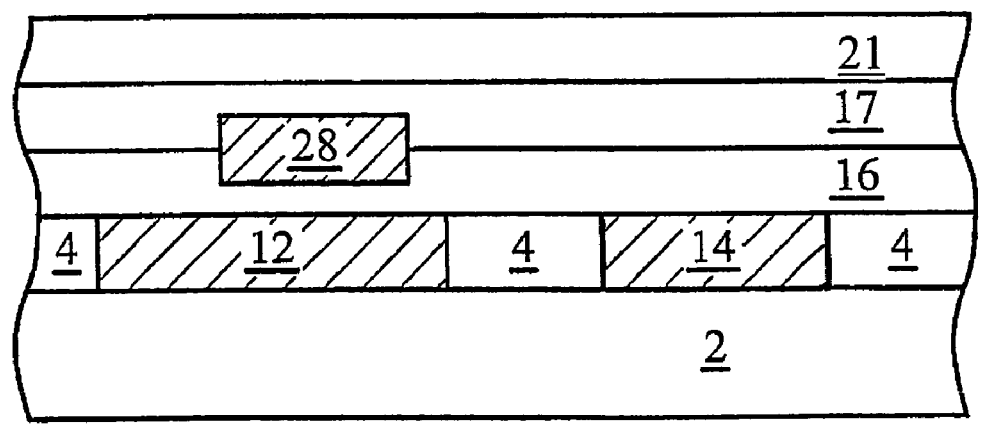
FIGS. 9A through 9C are cross-sectional views of a final assembly of an exemplary MIM capacitor.
Figure 9B:
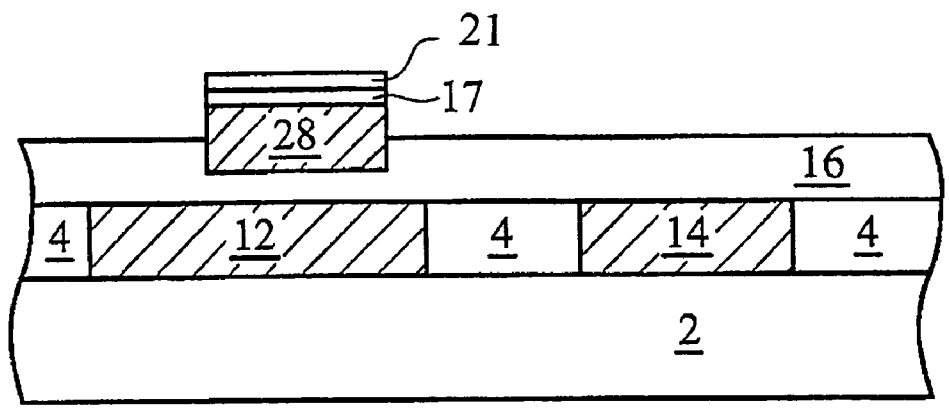
Figure 9C:
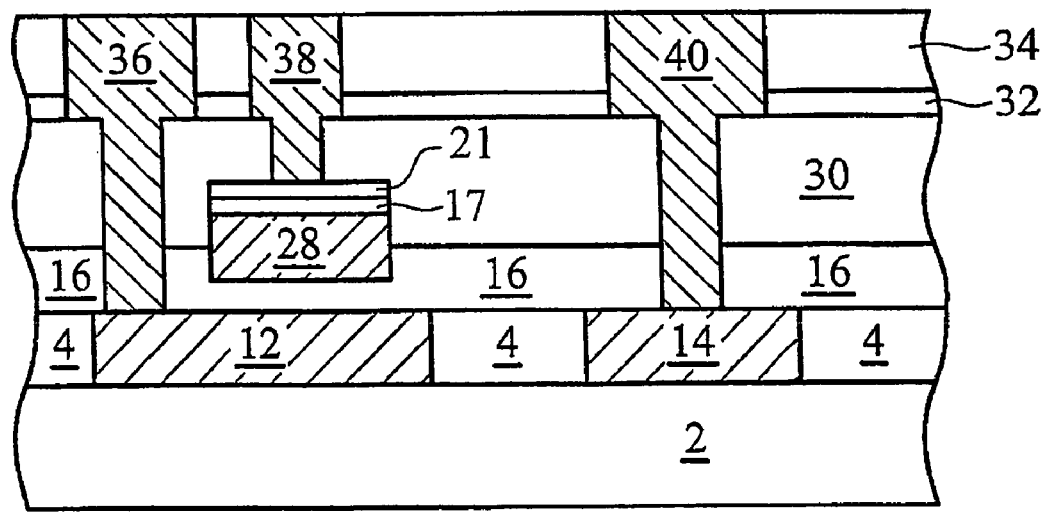

FIGS. 9A through 9C illustrate an exemplary structure including BEOL components. Specifically, etch stop layer 17 is deposited over the intermediate structure illustrated in FIG.

8, followed by an Anti-Reflective Coating (ARC) layer 21, using conventional materials and deposition processes. These layers are then patterned and removed from the device, except for where the layers overly CTM 28, as shown in FIG. 9B. One skilled in the art will recognize the need for ARC 21 overlying metal feature 28 to assist in subsequent photolithographic steps.

As illustrated in FIG. 9C, dielectric layer 30, etch stop layer 32, and dielectric layer 34 are next formed over the device. The thickness of these layers is not drawn to scale and some of the layers are exaggerated for purposes of illustration only. Layers 30, 32, and 34 preferably are realized as a conventional inter-metal dielectric (IMD) layer, using conventional materials and processes. Next, electrical connection is made to the CBM plate 12, the CTM plate 28, and the other interconnect feature 14, by way of via/trench connections 36, 38, and 40, respectively. These metal features 36, 38, and 40 are preferably formed using well known damascene or dual damascene processes.

Figure 10A:
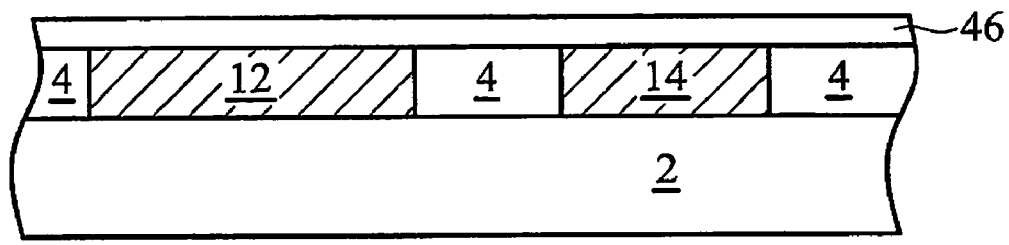
FIGS. 10A through 10C are cross-sectional views of intermediate stages of manufacture for a second embodiment of the present invention.
Figure 10B:
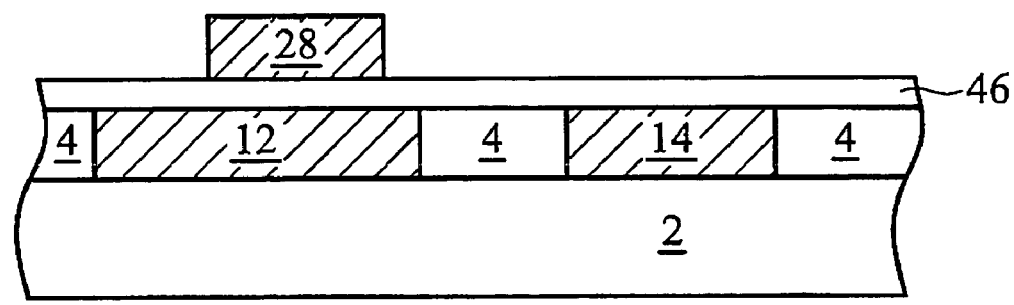
Figure 10C:
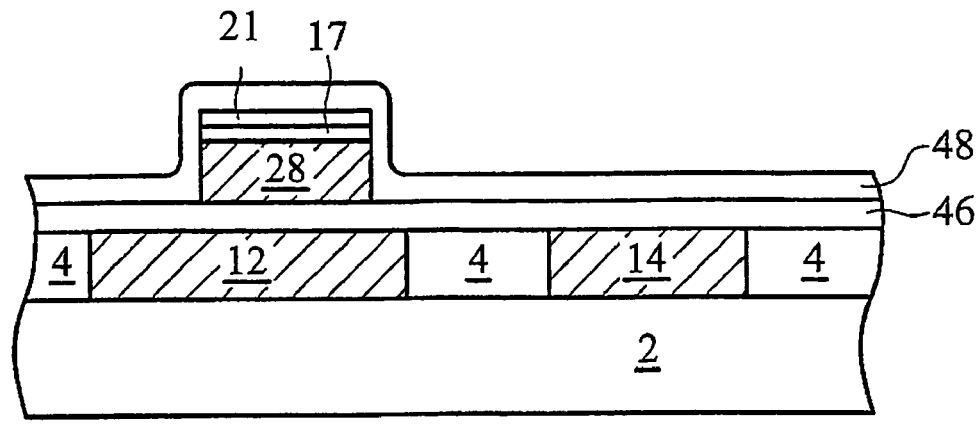
Figure 11:
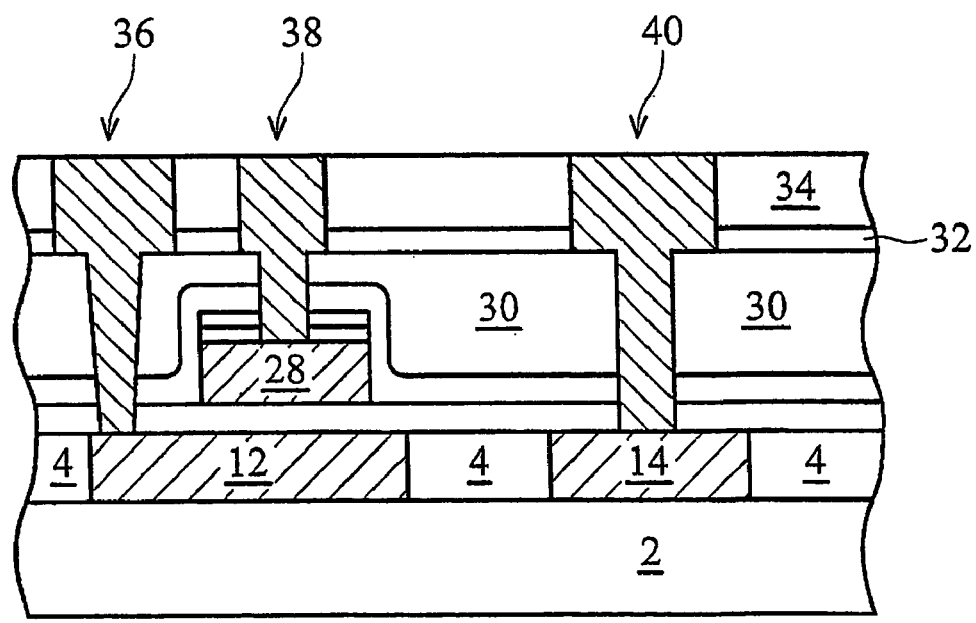
FIG. 11 is a cross-sectional view of final assembly of the MIM capacitor of the second embodiment of the present invention.

An alternative embodiment of the present invention is illustrated in FIGS. 10A through FIG. 11. This alternative embodiment process is identical to the above described process with regards to the steps illustrated in FIGS. 1, 2A and 2B.

FIG. 10A illustrates the intermediate structure illustrated in FIG. 2B, wherein a thin dielectric layer 46 has been deposited. Dielectric layer 46 is preferably formed of silicon carbon and is preferably deposited by CVD. In the illustrated embodiment, dielectric layer 46 is deposited to a thickness of from about 100 Angstroms to about 500 Angstroms—which is a desirable thickness range for achieving preferred capacitance characteristics in the subsequently formed MIM capacitor.

As illustrated in FIG. 10B, CTM 28 is next formed. CTM 28 is preferably formed by convention aluminum processes (blanket deposition, photolithography, etching, as is known in the art).

With reference to FIG. 10C, etch stop layer 17 and ARC 21 are formed over the device and patterned, using materials and processes similar to those described with reference to FIGS. 9A and 9B. This is followed by the formation of a second etch stop layer (ESL) 48, also as illustrated in FIG. 10C. ESL 48 is deposited over layer 46 in those regions not covered by CTM 28. This means that dielectric layer 46 retains its relative thinness in the region of the MIM capacitor, but that dielectric layer 46 and ESL 48 function collectively to form a thicker dielectric layer in those regions where the etch stop functionality is required. Preferably, dielectric layer 46 and ESL 48 have a combined thickness of about 500 Angstroms to about 1000 Angstroms. ESL 48 is preferably formed of the same material using the same deposition processes as dielectric layer 46. As a matter of design choice, other materials may be selected for ESL 48 having different or complimentary properties relative dielectric layer 46.

Having formed the MIM capacitor comprising CBM 12, dielectric layer 46, and CTM 28, processing preferably continues using conventional BEOL processes. FIG. 11 provides one exemplary structure in which IMD layers 30, 32 and 34 are formed over the structure and trench/via structures 36, 38, and 40 are formed to electrically connect to CBM 12, CTM 28, and interconnect feature 14, respectively.

In the preferred embodiment of the present invention only one additional mask for defining CTM 28 is required during the MIM capacitor formation process. CBM plate 12 pattern is defined together with metal feature 14, and hence no extra mask is required for this feature. Flexible thickness control over the via etch stop layer 17 (46/48) and the MIM capacitor insulator is achieved without complicated and costly processes.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the processes, materials and steps described in the specification. As one of ordinary skill in the art will readily appreciate from the disclosure of the present invention, processes, materials and steps, presently existing or later to be developed, that perform substantially the same function or achieve substantially the same result as the corresponding embodiments described herein may be utilized according to the present invention. Accordingly, the appended claims are intended to include within their scope such processes, materials and steps.

What is claimed is:

1. A method for forming a metal-insulator-metal (MIM) capacitor, comprising:
    forming a capacitor bottom plate and a metal interconnect feature on a substrate, both the capacitor bottom plate and the metal interconnect feature being located in a single plane that is parallel with a major surface of the substrate;
    forming a dielectric layer to a predetermined thickness, the dielectric layer having a first portion overlying the capacitor bottom plate and having a second portion overlying the metal interconnect feature;
    processing the dielectric layer to adjust a thickness of the first portion of the dielectric layer relative to a thickness of the second portion of the dielectric layer, wherein at least a part of the second portion of the dielectric layer overlying the metal interconnect feature remains at least as thick as the predetermined thickness; and
    forming a capacitor top plate directly over and immediately adjacent the first portion of the dielectric layer, wherein a region between the capacitor top plate and the capacitor bottom plate is filled by only the dielectric layer.

2. The method of claim 1 wherein processing the dielectric layer comprises etching the first portion of the dielectric layer.

3. The method of claim 1 wherein processing the dielectric layer comprises adding additional dielectric material over the second portion of the dielectric layer.

4. The method of claim 1 wherein said second portion of the dielectric layer functions as an etch stop layer.

5. The method of claim 1 further comprising:
    depositing an inter-metal dielectric layer over the capacitor top plate and the dielectric layer;
    etching vias in the inter-metal dielectric layer; and
    filling the vias with a conductor.

6. A method of forming an integrated circuit comprising:
    forming a plurality of circuit elements in a substrate;
    forming a first metal layer over the substrate, the first metal layer including a capacitor bottom plate and an interconnect feature;
    forming a dielectric layer of substantially uniform thickness over and in contact with the first metal layer;
    adjusting a thickness of the dielectric layer over the capacitor bottom plate, relative to a thickness of the dielectric layer over the interconnect feature such that the thickness of the dielectric layer over the interconnect feature remains at least as thick as the substantially uniform thickness;

forming a capacitor top plate over the capacitor bottom plate after the adjusting the thickness of the dielectric layer, such that the adjusted portion of the dielectric layer is in contact with and directly underlying the capacitor top plate; and forming an inter-metal dielectric layer over the capacitor top plate and the dielectric layer.

7. The method of claim 6 wherein the thickness of the dielectric layer is adjusted by etching a portion of the dielectric layer overlying the capacitor bottom plate.

8. The method of claim 7 wherein the thickness of the dielectric layer overlying the capacitor bottom plate is adjusted to a thickness of about 100 Angstroms to about 500 Angstroms.

9. The method of claim 6 wherein the capacitor top plate is formed prior to adjusting the thickness of the dielectric layer and wherein the thickness of the dielectric layer is adjusted by depositing additional dielectric material over the dielectric layer and the capacitor top plate.

10. The method of claim 6 wherein the dielectric layer is formed having a substantially uniform thickness of from about 100 Angstroms to about 1000 Angstroms.

* * * * *